United States Patent
Yu et al.

(10) Patent No.: US 10,439,597 B1
(45) Date of Patent: Oct. 8, 2019

(54) DUTY LOCKED LOOP CIRCUIT

(71) Applicant: Qualcomm Incorporated, San Diego, CA (US)

(72) Inventors: Guolei Yu, Singapore (SG); Ajay Kumar Kosaraju, Singapore (SG); Charles Tuten, Scottsdale, AZ (US); Marko Koski, Chandler, AZ (US); Aniruddha Bashar, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/953,157

(22) Filed: Apr. 13, 2018

(51) Int. Cl.
*H03K 3/017* (2006.01)
*H03K 3/023* (2006.01)
*H03H 7/06* (2006.01)
*H03K 19/20* (2006.01)

(52) U.S. Cl.
CPC ............ *H03K 3/017* (2013.01); *H03K 3/023* (2013.01); *H03H 7/06* (2013.01); *H03K 19/20* (2013.01)

(58) Field of Classification Search
CPC ........ H03K 3/017; H03K 19/20; H03K 3/023; H03K 3/027; H03K 5/156; H03K 5/04; H03K 5/1565; H03K 7/08; H03H 7/06
See application file for complete search history.

(56) References Cited

U.S. PATENT DOCUMENTS

| | | | |
|---|---|---|---|
| 6,456,133 B1* | 9/2002 | Nair | H03K 5/1565 327/173 |
| 6,744,281 B2* | 6/2004 | Harrison | G06F 1/08 326/28 |
| 7,323,919 B2* | 1/2008 | Yang | H03F 3/217 327/172 |
| 7,898,309 B1 | 3/2011 | Dogan | |
| 8,380,138 B2 | 2/2013 | Wadhwa et al. | |
| 8,564,346 B2 | 10/2013 | Quan et al. | |
| 8,736,329 B1 | 5/2014 | Rajavi et al. | |

\* cited by examiner

*Primary Examiner* — Jung Kim
(74) *Attorney, Agent, or Firm* — Michael R. Harris

(57) ABSTRACT

The present disclosure provides a duty locked loop circuit that includes a switch network including a first electronic switch device controlled by a first control signal that is based on a first input signal and a second electronic switch device controlled by a second control signal that is based on a second input signal. The duty locked loop circuit includes an integrator circuit electrically connected to the switch network. The integrator circuit is configured to generate an output voltage proportional to an integral of a difference between a first duty cycle of the first input signal and a second duty cycle of the second input signal. The duty locked loop circuit includes an output circuit configured to generate an output signal having an output duty cycle that is based on the output voltage.

18 Claims, 11 Drawing Sheets

US 10,439,597 B1

DUTY LOCKED LOOP CIRCUIT

FIELD

The present disclosure relates generally to a duty locked loop (e.g., duty cycle compare circuit), and particularly to a duty locked loop circuit in a feedback loop of a switched mode power supply circuit.

BACKGROUND

Many electronic devices include complex systems for processing, storing, and displaying data. One of these systems regulates power, such as through power regulation circuits. These power regulation circuits regulate battery or external power, including through use of lower-voltage power rails from which components of the device operate. For example, a switched mode power supply may be configured to provide a constant voltage for a particular component. In some cases, current draw of certain components (e.g., those with large current load steps) can cause voltage of the power rail to change abruptly. The voltage drop due to the transient current draw may occur until a feedback loop causes the voltage to return to the target level. Feedback circuits, including duty locked loop circuits, are needed for next generation power regulation circuits to improve output voltage stability in response to transient conditions.

SUMMARY

In one aspect of the disclosure, a duty locked loop circuit is provided. The duty locked loop circuit includes a first electronic switch device configured to be controlled by a first control signal that is based on a first input signal having a first duty cycle. The first electronic switch device is electrically connected between a first supply voltage and a first node. The first supply voltage has a first voltage level. The duty locked loop circuit further includes a second electronic switch device configured to be controlled by a second control signal that is based on a second input signal having a second duty cycle. The second electronic switch device is electrically connected between the first node and a ground voltage. The duty locked loop circuit further includes an integrator circuit having a first integrator input, a second integrator input, and an integrator output. The first integrator input is electrically connected to the first node. The second integrator input is electrically connected to a second supply voltage having a second voltage level that corresponds to the first voltage level of the first supply voltage scaled by a predetermined amount. The duty locked loop circuit further includes a filter circuit electrically connected to the integrator output. The duty locked loop circuit further includes an output circuit electrically connected to a filter output of the filter circuit and configured to generate an output signal having a third duty cycle. A magnitude of the third duty cycle is based on an output voltage level at the filter output of the filter circuit. The output signal is configured to be provided as the second input signal.

In another aspect of the disclosure, a method for power regulation in a switched mode power supply circuit is provided. The method includes generating an output voltage proportional to an integral of a difference between a first duty cycle of a first input signal and a second duty cycle of a second input signal using an integrator circuit having an integrator input controlled by a switch network controlled by the first input signal and second input signal. A voltage level at the integrator input is based on a first voltage level of a supply voltage and a second voltage level that corresponds to the first voltage level of the supply voltage scaled by a predetermined amount. The method further includes generating an output signal having an output duty cycle that is based on the output voltage and is synchronized to an edge of a clock signal. The method includes providing the output signal to the switched mode power supply circuit.

In yet another aspect of the disclosure, a duty locked loop circuit is provided. The duty locked loop circuit includes a switch network including a first electronic switch device controlled by a first control signal that is based on a first input signal. The switch network further includes a second electronic switch device controlled by a second control signal that is based on a second input signal. The duty locked loop circuit further includes an integrator circuit electrically connected to the switch network. The integrator circuit is configured to generate an output voltage proportional to an integral of a difference between a first duty cycle of the first input signal and a second duty cycle of the second input signal. A voltage level at an integrator input is based on a first voltage level of a supply voltage and a second voltage level that corresponds to the first voltage level scaled by a predetermined amount. The duty locked loop circuit further includes an output circuit configured to generate an output signal having an output duty cycle that is based on the output voltage.

In yet another aspect of the disclosure, a duty locked loop circuit is provided. The duty locked loop circuit includes means for controlling an input voltage proportional to difference between a first duty cycle of a first input signal a second duty of a second input signal. The duty locked loop circuit further includes means for performing an integration operation of the input voltage to generate an output voltage based on the difference. The duty locked loop circuit further includes means for generating an output signal having an output duty cycle that is based on the output voltage.

DETAILED DESCRIPTION

Figure 1:
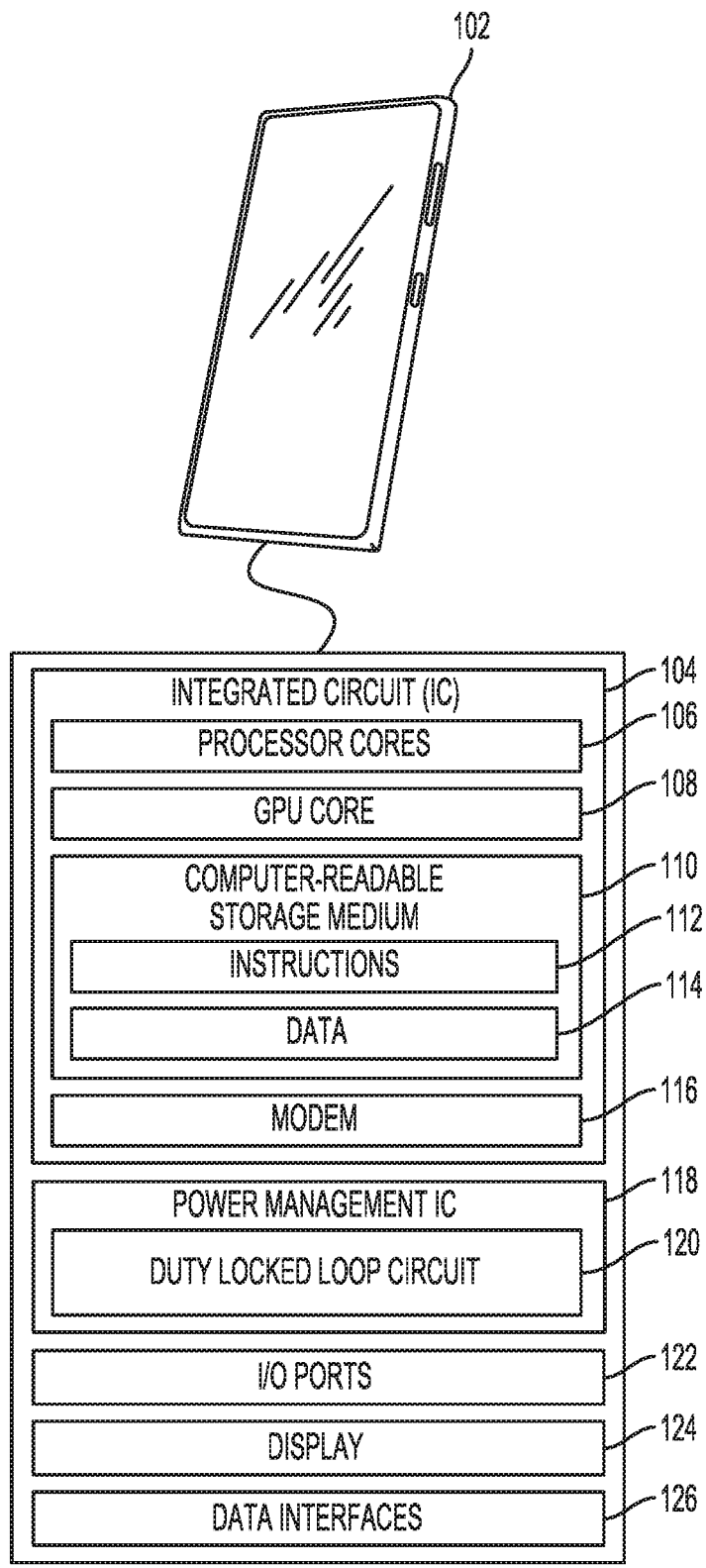
FIG. 1 is a functional block diagram of a computing device (e.g., a smart phone) in which aspects of a switched mode power supply circuit with a duty locked loop circuit can be implemented.

The detailed description set forth below in connection with the appended drawings is intended as a description of exemplary implementations and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

A power regulation circuit such as a switched mode power supply circuit (SMPS circuit) may use one or more pulse width modulated (PWM) signals to control one or more switch devices to provide a regulated output voltage. The SMPS circuit may include a feedback circuit that includes a duty locked loop that improves responses to fast transient current changes in the load. The duty locked loop (also referred to herein as a duty cycle compare circuit) may be configured to generate a PWM signal with a duty cycle that corresponds to the average duty cycle of the system over some time period. This average duty cycle is provided as part of a control loop that enables control of the DC operating point. The accuracy of the duty locked loop circuit should be very high in order to provide high DC accuracy in all operating scenarios including in transient conditions. Certain implementations of duty locked loops, e.g., based on charge pumps, may suffer from mismatch between currents that leads to output duty cycle error. This output error can cause degradation of the accuracy of the DC operating point that increases undesirable output offset. Circuitry to correct such mismatch may be complicated or difficult, particularly for low power designs with low nominal currents.

Certain aspects of the present disclosure relate to an implementation of a duty locked loop circuit that provides a highly accurate PWM signal corresponding to an average duty-cycle of the input PWM signal (e.g., match the duty cycle of one signal to the duty cycle of the other over some time period). The duty locked loop circuit may have reduced complexity and allow for low power designs with low nominal currents while maintaining accuracy. The output of the duty locked loop circuitry may be provided to adjust signals used to drive the switches in a switched mode power supply (or other similar voltage regulation circuit). In an aspect, a duty locked loop circuit that provides high accuracy and low complexity is provided that includes an integrator circuit with a switch network that is configured to detect a difference between duty cycles.

For example, a duty locked loop circuit according to the disclosure may include a switch network including a first switch device controlled by a first control signal that is based on first input signal and a second switch device controlled by a second control signal that is based on a second input signal. The duty locked loop circuit may include an integrator circuit electrically connected to the switch network. The integrator circuit is configured to generate an output voltage proportional to the integral of the difference between a first duty cycle of the first input signal and a second duty cycle of the second input signal. In an aspect, a voltage level at an integrator input is based on a first voltage level of a supply voltage and a second voltage level that corresponds to the first voltage level scaled by a predetermined amount. The duty locked loop circuit further includes an output circuit configured to generate an output signal having an output duty cycle that is based on the output voltage.

FIG. 1 is a functional block diagram of a computing device 102 (e.g., a smart phone) in which aspects of a switched mode power supply circuit with a duty locked loop circuit can be implemented. Although not shown, the computing device 102 may be implemented as any suitable computing or electronic device, such as a modem, cellular base station, broadband router, access point, cellular phone, gaming device, navigation device, media device, laptop computer, desktop computer, tablet computer, server, set-top box, network-attached storage (NAS) device, smart appliance, vehicle-based communication system, or other similar devices. Alternately or additionally, components of the computing device 102 may be embodied on a printed circuit board assembly that resides in a chassis, frame, body, or enclosure of the computing device 102.

The computing device 102 includes an integrated circuit 104 (IC 104), which may be configured as any suitable type of circuit or chip, such as an integrated circuit (IC), application-specific IC (ASIC) or system-on-chip (SoC). In this particular example, the IC 104 includes processor cores 106, a graphics processing unit core 108 (GPU core 108), and a computer-readable storage medium 110 (CRM 110). Although shown as a multi-processor-core IC, the IC 104 may alternately be implemented with a single processor core. The IC 104 may include any suitable number of processor cores 106, configured similarly or differently from each other.

For example, the processor cores 106 may be configured as a multi-core processor (e.g., hexa-core or octa-core processor) in which one of the cores has a maximum operating frequency, cache size, power consumption, or instruction set that differs from those of another processor core. Alternately or additionally, the processor cores 106 may have various operating states or power states that range from inactive to fully active, such as powered-down (e.g., mechanical off), deep-sleep, sleep, idle, active, performance, and so on. In each of these states, a voltage or clock frequency of a processor core may be adjusted or altered accordingly to accommodate a corresponding decrease or increase in processor activity. For example, processor core voltage and operational frequency may be increased to provide more processing performance. Alternately, the processor core voltage and operational frequency may be decreased to minimize power consumption or extend device run-time. The processor cores 106 may be grouped or configured as any suitable type of processor, such as an application processor, configured to execute processor-executable code stored by the computer-readable storage medium (CRM) 110.

The GPU core 108 may be configured to process visual-related data or graphical content for presentation or display to a user. In some cases, the GPU core 108 includes dedicated processing pipelines for rendering polygons, vectors, shading, ray traces, texture, and the like. The GPU core 108 may also have various operating states or power states that range from inactive to fully active, such as powered-down, sleep, idle, active, and so on. In each of these states, a voltage or clock frequency of the GPU core 108 may be adjusted accordingly to accommodate a corresponding decrease or increase in GPU core activity. For example, the voltage and clock frequency of the GPU core 108 may be reduced when the GPU core is throttled, idled, or in a sleep state (e.g., low-power state).

The CRM 110 (e.g., memory) of the computing device 102 stores information of the IC 104, such as data of the processor cores 106 and the GPU core 108. Although not shown, the CRM 110 may include a memory controller that manages access to the CRM 110 or other memories of the computing device 102. The CRM 110 may include any suitable type of data storage media, such as volatile memory (e.g., random access memory (RAM)), dynamic RAM (DRAM), static RAM (SRAM), non-volatile memory (read-only memory (ROM)), or Flash memory. In the context of this disclosure, the CRM 110 is implemented to store instructions 112, data 114, or other information of the IC 104, and thus does not include transitory propagating signals or carrier waves.

A modem 116 of the IC 104 provides a digital communication interface for data, voice, messaging, and other applications of the IC 104. The modem 116 may include baseband circuitry to perform high-rate sampling processes, such as analog-to-digital conversion, digital-to-analog conversion, gain correction, skew correction, or frequency translation. The modem 116 may also support multiple types of wireless communication and provide an interface with a radio frequency (RF) transceiver, RF front end, and antennas (not shown) of the computing device 102 to facilitate communication via a wireless network or peer-to-peer connection.

The computing device 102 also includes a power management integrated circuit 118 (PMIC 118) for power regulation that may include a duty locked loop circuit 120 that may be part of a switched mode power supply circuit. The PMIC 118 can regulate external or internal power of the computing device 102 to provide regulated power for the IC 104 or other components and subsystems of the computing device 102. In some cases, the PMIC 118 regulates power received from a battery or external supply of the computing device 102 to provide lower-voltage power rails for the IC 104 and the other components. The duty locked loop circuit is configured to provide an average duty cycle of a PWM signal in a switched mode power supply circuit. Multiple switched mode power supply circuit circuits (e.g., 8 or more or less) may be provided to provide different stable voltage levels to different components.

In various configurations, the computing device 102 may also include input/output ports 122 (I/O ports 122), a display 124, and/or data interfaces 126. The I/O ports 122 enable data exchanges or interaction with other devices, networks, or users. The I/O ports 122 may include serial ports (e.g., universal serial bus (USB) ports), parallel ports, audio ports, infrared (IR) ports, or other like ports. The display 124, when implemented natively, presents graphics of the computing device 102, such as a user interface of elements rendered by the GPU core 108 for an operating system, program, or application of the computing device 102. Alternately or additionally, the display 124 may be implemented as a display port or virtual interface, through which graphical content of the computing device 102 is transmitted by the computing device 102 for presentation at another display.

The data interfaces 126 provide connectivity to respective networks and other electronic devices connected therewith. The data interfaces 126 may include wired data interfaces, wireless data interfaces, or any suitable combination thereof. Example wired data interfaces of the computing device 102 include Ethernet, USB-based, or fiber optic interfaces for communicating information over a local network, intranet, or the Internet. Alternately or additionally, the computing device 102 may have wireless interfaces that enable communication over a wireless network, such as a wireless LAN, peer-to-peer (P2P), cellular network, and/or wireless personal-area-network (WPAN). In such cases, the wireless interfaces may be implemented separately from, or in conjunction with, the modem 116 and other RF circuitry of the IC 104.

Figure 2:
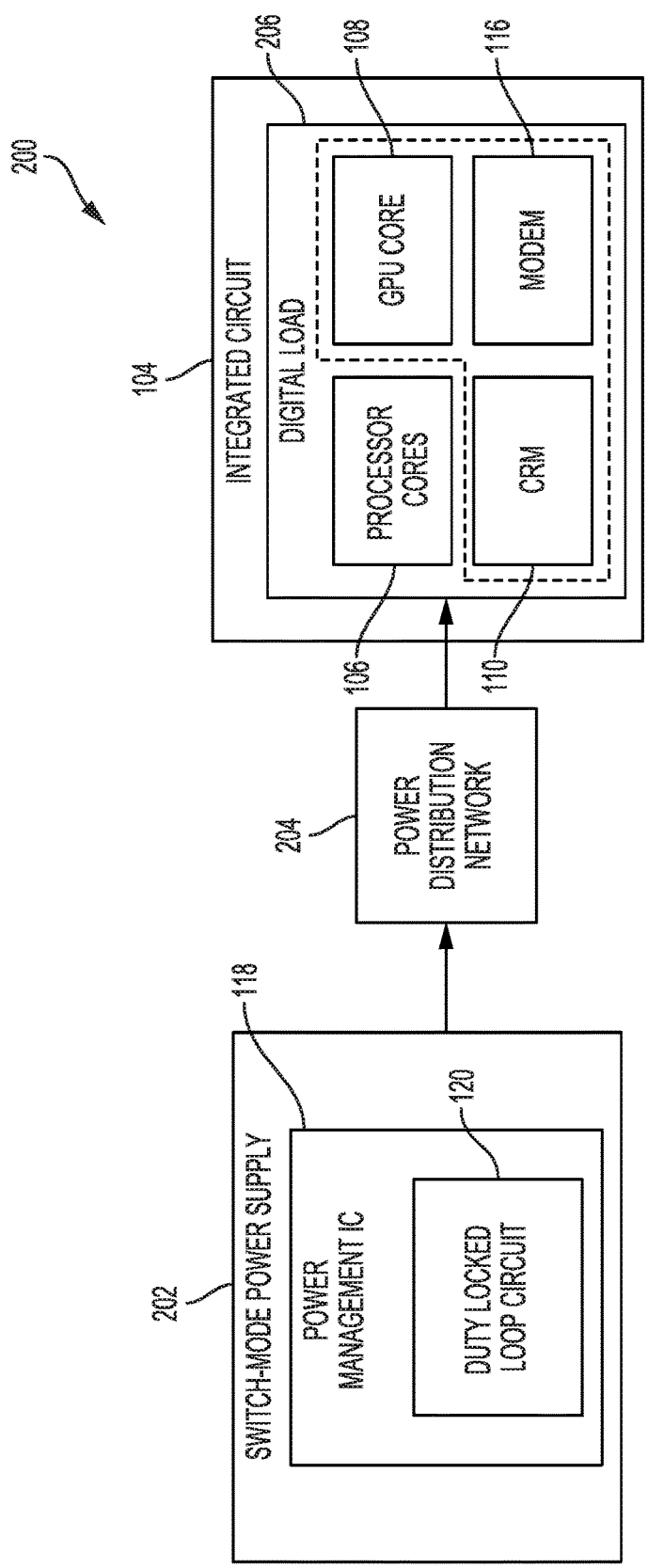
FIG. 2 is a functional block diagram of an example configuration of an integrated circuit and a power management integrated circuit.

FIG. 2 illustrates an example configuration of an integrated circuit 104 and a PMIC 118 generally at 200. In this example, the PMIC 118 is implemented as a controller of a switched mode power supply 202 (SMPS 202). The SMPS 202 may be configured as any suitable type of switching regulator, such as a high frequency SMPS (e.g., above 1 MHz) or multi-phase SMPS. The PMIC 118 may regulate characteristics of power (e.g., voltage or current) provided by the SMPS 202 by controlling or driving switch devices (not shown) of the SMPS 202. The switch devices of the power supply may be integrated with the PMIC 118 or implemented as discrete components coupled to the PMIC 118 on a printed circuit board assembly (PCBA) on which the PMIC 118 is disposed. Alternately or additionally, the SMPS 202 may be implemented as a buck converter that decreases voltage of source power (e.g., input power), a boost converter that increases voltage of the source power, or a combination boost-buck converter capable of both boosting or bucking voltage of the source power.

An output of the SMPS 202 is coupled to a power distribution network 204. The power distribution network 204 distributes regulated power to components or subsystems of the computing device 102, such as the IC 104, I/O ports 122, display 124, or data interfaces 126. The power distribution network 204 may include conductive (e.g., copper) traces or portions of conductive planes of a printed circuit board (PCB) or flexible printed circuit (FPC) for distributing the regulated power. In some cases, the conductors of the power distribution network 204 may include or introduce routing parasitics (e.g., capacitance) that affect an output voltage of the SMPS 202. Alternately or additionally, the power distribution network 204 may include filtering or suppression components, such as filter capacitors or ferrites, to mitigate noise or interference in the power distribution network 204.

In this example, the power distribution network 204 couples the SMPS 202 to a digital load 206 of the integrated circuit 104. The digital load 206 may include any suitable type of component or block of the IC 104, such as a processor core, GPU core, communications processor, digital signal processor (DSP), memory, or media encoder. Although shown as a single coupling (e.g., power rail), each digital load or component of the integrated circuit 104 may operate at a different respective voltage level. As such, the SMPS 202 or other power supplies can provide power to the integrated circuit 104 via multiple different power rails at multiple different voltages. In some cases, the voltage of power provided by the SMPS 202 ranges from approximately 0.5 volts to 3.3 volts. Alternately or additionally, an output voltage level of the SMPS 202 can be dynamically adjusted at any suitable resolution. The switched mode power supply 202 includes a duty locked loop circuit 120 as will be further described below.

With reference to FIG. 2, the digital load 206 includes the processor cores 106 of the integrated circuit 104, which may be implemented as cores of an application processor. In some cases, each of the multiple processor cores 106 includes a separate power rail by which the SMPS 202 or another power supply provides operational power. As such, operational parameters of each processor core 106, such as core voltage or frequency, can be independently monitored or controlled without affecting operation of the other processor cores. As shown in FIG. 2, the digital load 206 of the integrated circuit 104 may also include the GPU core 108, CRM 110, and modem 116. For example, the integrated circuit 104 may be implemented as a system-on-chip (SoC) that includes instances of these components, each of which are configured to receive power regulated by the PMIC 118 via the power distribution network 204.

Figure 3:
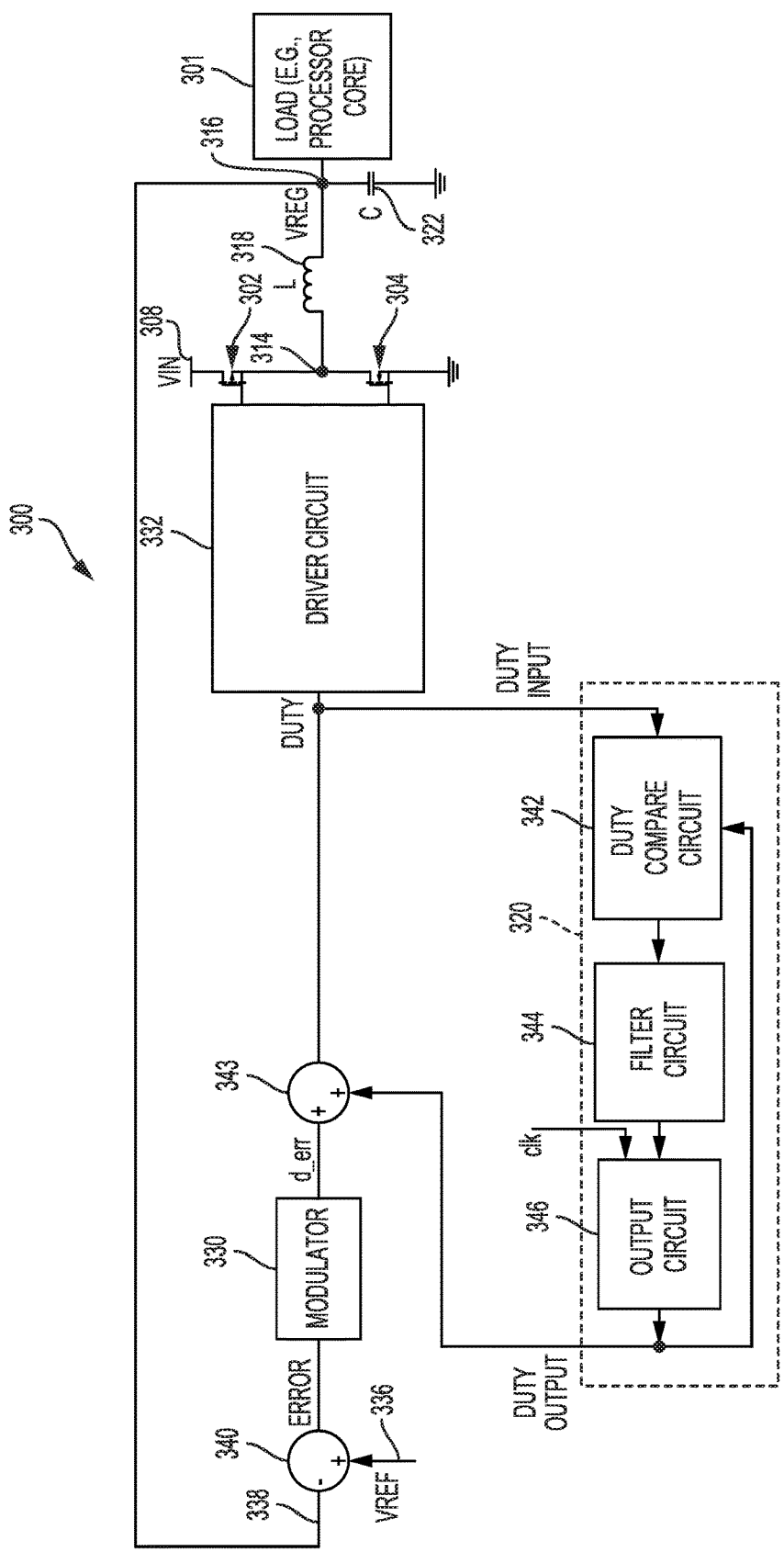
FIG. 3 is a schematic diagram of an example of a switched mode power supply circuit with a digital load.

FIG. 3 is a schematic diagram of an example of a switched mode power supply circuit 300 (SMPS circuit 300) with a load 301 (shown as a processor core for exemplary purposes). Although described in reference to a single-phase voltage-reducing buck regulator, the aspects and techniques herein may be applied to other types of power supplies or power regulation topologies, multi-phase switching regulators, boost converters, buck-boost converters, linear regulators, battery charging systems, and so on. Further, signal-carrying or current-carrying structures of the circuits may be implemented as any suitable type of conductor, such as wires, printed circuit board (PCB) traces, etched metal layers, planes, contacts, nets, paths, rails, or other like couplings. The use of these terms is not meant to limit a configuration of any circuit, but to provide context for describing the circuits of the accompanying figures.

The SMPS circuit 300 includes electronic switch devices 302 and 304 (e.g., a switch stack). For purposes of illustration, the electronic switch devices 302 and 304 may be configured as a p-channel metal-oxide-semiconductor field-effect transistor (p-channel MOSFET) and an n-channel MOSFET, respectively. In other implementations, other electronic switch devices can be used. The electronic switch device 302 has a source coupled to a power rail with an input voltage 308. The electronic switch device 304 has a source coupled to a lower potential, which is shown as ground in this example. Respective drains of the electronic switch devices 302 and 304 are coupled together at a switch voltage node 314. Any suitable external or discrete components may be coupled to the switch voltage node 314 such as energy storage components or filter components.

The SMPS circuit 300 regulates power by alternately closing either of the electronic switch device 302 or the electronic switch device 304 to source current to a load 301 connected to an output of the SMPS circuit 300 (e.g., output node 316). Depending on current loading, respective on-times of either or both electronic switch devices 302 and 304 can be adjusted such that regulated power is provided at a particular voltage at the output of the SMPS circuit 300.

The switch voltage node 314 may be connected to energy storing components to filter or smooth the power regulated by the SMPS circuit 300. In this example, the switch voltage node 314 is coupled to an inductor 318 and capacitor 322 that are configured as an inductor-capacitor (LC) filter to filter the power at the switch voltage node 314 to provide regulated power provided at an output node 316 of the SMPS circuit 300 at a target output voltage.

The SMPS circuit 300 also includes a modulator 330 and a driver circuit 332. The modulator 330 and the driver circuit 332 are configured to control the electronic switch devices 302 and 304 to regulate the output voltage at the output node 316. The modulator 330 and the driver circuit 332 may implement any suitable control or switching mode to regulate power, such as a pulse-width modulation (PWM) mode, a pulse-frequency modulation (PFM) mode, a pulse-skipping mode, or like operational modes. The modulator 330 is configured to generate respective control signals for the driver circuit 332 to control the electronic switch devices 302 and 304. The driver circuit 332 is electrically coupled between the modulator and the respective control terminals (e.g., gates) of the electronic switch devices 302 and 304 to ensure that the electronic switch devices 302 and 304 are driven with sufficient current to achieve full turn-on for efficient switching.

The modulator 330 may generate the control signals for the electronic switch devices 302 and 304 based on a difference signal (e.g., error) from a difference signal generator circuit 340. The difference signal generator circuit 340 is configured to receive a reference voltage 336 and a feedback signal 338 received from the output node 316 and output the difference signal indicative of a difference between the reference voltage and the voltage at the output node 316. The modulator 330 may generate control signals for the electronic switch devices 302 and 304 based on a comparison of the feedback signal 338 and a reference voltage 336 via the difference signal generator circuit 340. The modulator 330 may be configured to output a modulator output signal that is a PWM signal with a particular duty cycle. The driver circuit 332 drives the electronic switch devices 302 and 304 based on the magnitude of the duty cycle of the modulator output signal.

The SMPS circuit 300 may also include a duty locked loop circuit 320. The duty locked loop circuit 320 is configured to receive a duty input signal having a first duty cycle. The duty input signal may correspond to the signal provided to the driver circuit 332. The duty locked loop circuit 320 is configured to generate a duty output signal having a second duty cycle corresponding to an average of the first duty cycle over some time period based on a difference between the first duty cycle of the duty input signal and a second duty cycle of the duty output signal that is provided as a feedback signal. The duty locked loop circuit 320 is configured to regulate the DC operating voltage by forming a positive feedback loop with the output of the modulator circuit 330 via a positive feedback circuit 343. The positive feedback circuit 343 is configured to adjust the modulator output signal based on the duty output signal of the duty locked loop circuit 320. As shown in FIG. 3, output of the positive feedback circuit 343 is fed back to the input of the duty locked loop circuit 320. At equilibrium, the input "d_err" to the positive feedback circuit 343 is substantially zero to make the output of the positive feedback circuit 343 stop growing. The value "d_err" at the output of the modulator 330 is driven to zero by the feedback loop formed by components including the driver circuit 332, the electronic switch devices 302 and 304 (e.g., FETs), the output filter elements 318 and 322, the difference signal generator circuit 340 (e.g., error amplifier), and the modulator 330.

The duty locked loop circuit 320 may include a duty compare circuit 342 configured to receive the duty input signal as well as the duty output signal as a feedback signal. The duty compare circuit 342 is configured to output a duty compare signal that is proportional to the integral of the difference between a first duty cycle of the duty input signal and a second duty cycle of the duty output signal. The duty locked loop circuit 320 includes a filter circuit 344 that is electrically coupled to the duty compare circuit 342 and is configured to filter an output of the duty compare circuit 342 to provide a filtered signal (e.g., substantially a DC voltage level) proportional to the integral of the difference between the first duty cycle of the duty input signal and the second duty cycle of the duty output signal. The duty locked loop circuit 320 includes an output circuit 346 electrically coupled to the filter circuit 344 and is configured to receive the filter output of the filter circuit along with a clock signal. The output circuit 346 is configured to generate the duty output signal that has a duty cycle that is based on the filtered output that is proportional to the integral of the difference between the first duty cycle of the duty input signal and the second duty cycle of the duty output signal. As a result, when the two duty cycles are different, the duty output signal is configured to have a duty cycle that is closer to the first duty cycle of the duty input signal after a cycle. The clock signal is provided to align an edge (e.g., rising or falling) of the clock signal with an edge of the duty output signal. The duty output signal is provided to the duty compare circuit 342 as a feedback signal. The duty output signal is provided to the positive feedback circuit 343 that adjusts the modulator output signal of the modulator 330 to regulate the DC operating voltage.

As noted, certain implementations of the duty locked loop circuit 320 have issues with current mismatch that reduces accuracy and impacts regulator performance. Certain current trimming solutions that reduce effect of mismatch may be complex or difficult to implement (e.g., for low power designs). Aspects of certain embodiments relate to implementations of duty locked loop circuits that provide certain advantages over other implementations while providing high accuracy.

Figure 4:
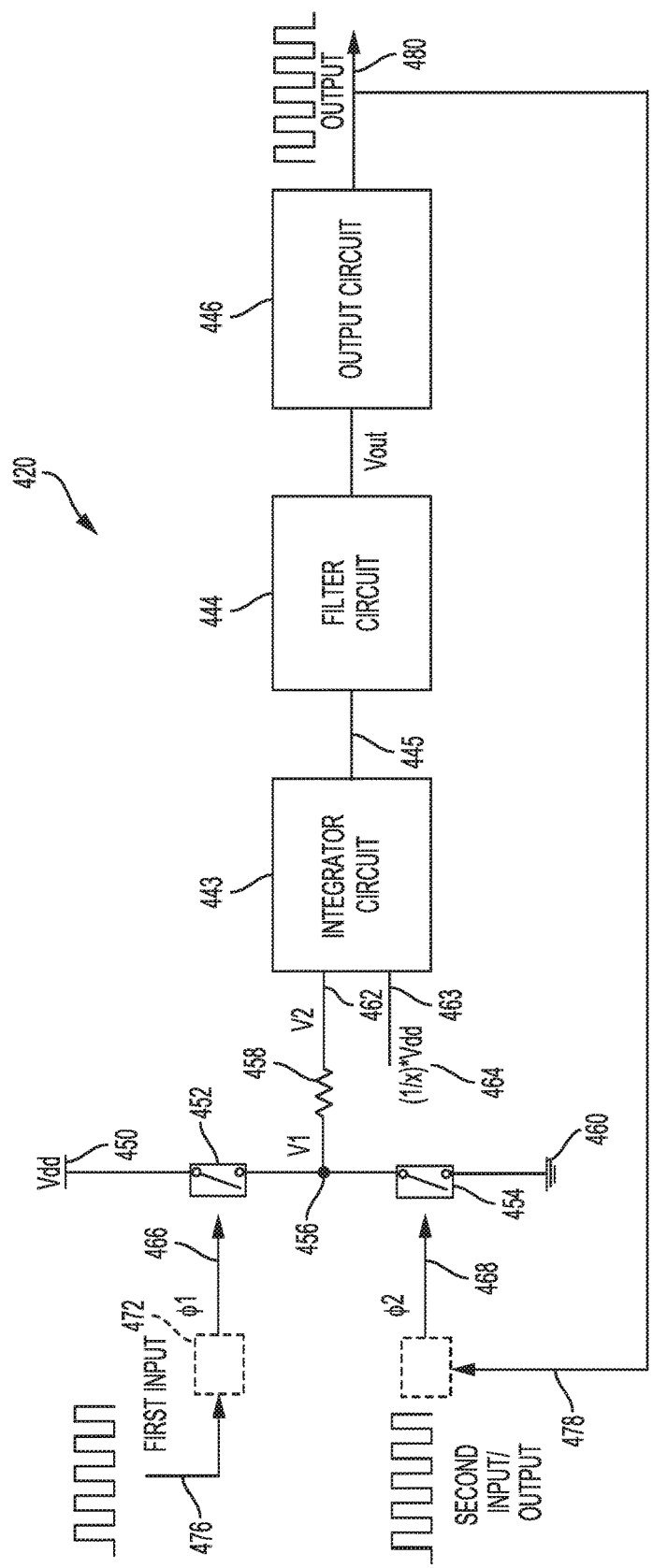
FIG. 4 is a schematic diagram of an example of a duty locked loop circuit in accordance with one or more aspects.

FIG. 4 is a schematic diagram of an example of a duty locked loop circuit 420 in accordance with one or more aspects. The duty locked loop circuit 420 includes a first electronic switch device 452 (e.g., transistor) configured to be controlled by a first control signal 466 (also shown by the label Φ1) that is based on a first input signal 476 having a first duty cycle. In an aspect, a duty cycle or magnitude of a duty cycle as described herein may generally refer to an amount of time during a cycle a signal remains at one of two levels (e.g., percentage of time a signal remains "high" for a cycle such as for a PWM signal). The first electronic switch device 452 is electrically connected between a first supply voltage 450 and a first node 456. The first supply voltage 450 has a first voltage level. The first control signal 466 is based on the first input signal 476. Optionally, the duty locked loop circuit 420 may include a first control signal generator circuit 472 configured to receive the first input signal 476 and output the first control signal 466 based on the first input signal 476. Examples of the first control signal generator circuit 472 are described below. However, in some aspects, the first input signal 476 may be the first control signal 466. The first control signal 466 is configured to cause the first electronic switch device 452 to selectively electrically connect the first supply voltage 450 to the first node 456.

The duty locked loop circuit 420 includes a second electronic switch device 454 (e.g., transistor) configured to be controlled by a second control signal 468 (also shown by the label Φ2) that is based on a second input signal 478 having a second duty cycle. The second electronic switch device 454 is electrically connected between the first node 456 and a ground voltage 460 corresponding to an electrical ground relative to the first voltage level of the first supply voltage 450. The second control signal 468 is based on the second input signal 478. Optionally, the duty locked loop circuit 420 may include a second control signal generator circuit 474 configured to receive the second input signal 478 and output the second control signal 468 based on the second input signal 478. Examples of the second control signal generator circuit 474 are described below. However, in some aspects the second input signal 478 may be the second control signal 468. The second control signal 468 is configured to cause the second electronic switch device 454 to selectively electrically connect the first node 456 to the ground voltage 460.

The first and second electronic switch devices 452 and 454 may be transistors such as MOSFETs. For example, the first electronic switch device 452 may be an p-channel MOSFET while the second electronic switch device 454 may be a n-channel MOSFET. Other transistor or switch types are also possible and not excluded for the first and second electronic switch devices 452 and 454.

The duty locked loop circuit 420 includes an integrator circuit 443 having a first integrator input 462, a second integrator input 463, and an integrator output 445. The first integrator input 462 is electrically connected to the first node 456 via a resistor 458. The second integrator input 463 is electrically connected to a second supply voltage 464 having a second voltage level that corresponds to the first voltage level of the first supply voltage 450 scaled by a predetermined amount. For example, the second voltage level of the second supply voltage 464 may be substantially or exactly half of the first voltage level of the first supply voltage 450. Other values may work as well in different applications (e.g., scaled by ⅓ or ¼ or by some other (1/x) amount of the first supply voltage). In an aspect, producing a very accurate voltage level corresponding to half of the first voltage level of the first supply voltage 450 may be quite feasible without adding overly complicated or costly circuitry. The ability to cost effectively provide a highly accurate second voltage level of the second supply voltage 464 increases the overall accuracy of the output of the duty locked loop circuit 420.

The integrator circuit 443 is configured to output a voltage that is proportional to an integral of the input voltage (voltage V2 at 462). In general, the magnitude of the voltage at the integrator output 445 is based on the loop and is adjusted to a level so that the duty output signal 480 approaches the same duty cycle as the first input signal 476. The second integrator input 463 electrically connected to the second supply voltage 464 may be configured to control, at least in part, the voltage V2 at the first integrator input 462. In an aspect, the voltage V2 at the first integrator input 462 is configured to be maintained substantially at the level of the second supply voltage 464.

In an aspect, an integrator output level at the integrator output 445 is proportional to the integral of duty cycle difference between the first duty cycle of the first input signal 476 and the second duty cycle of the second input signal 478 by using the electronic switch devices 452 and 454 to control the voltage at the first node 456 based on the duty cycles of the first and second input signals 476 and 478.

The duty locked loop circuit 420 includes a filter circuit 444 electrically connected to the integrator output 445 of the integrator circuit 443. The filter circuit 444, for example, may be a low pass filter circuit configured to provide a generally DC voltage level at the filter output (Vout), or any other filter configuration to provide the desired loop response.

The duty locked loop circuit 420 further includes an output circuit 446 electrically connected to a filter output of the filter circuit 444. The output circuit 446 is configured to generate an output signal 480 having a third duty cycle (e.g., an output duty cycle). A magnitude of the third duty cycle of the output signal 480 is based on an output voltage level at the filter output of the filter circuit 444. The output signal 480 is configured to be provided as the second input signal

478. In other words, the output signal 480 is provided as a feedback signal as the second input signal 478 in a feedback path.

In implementations in the context of power regulation, the output circuit 446 is configured to provide the output signal 480 to a switched mode power supply circuit 300 (FIG. 3). However, it should be appreciated that while discussed in the context of power regulation circuitry the duty locked loop circuitry as described herein may be used in other applications where it may be needed to compare or match duty cycles between two signals.

As a further description of the principle of operation of the duty locked loop circuit 420, the first control signal 466 is based on the first input signal 476 having the first duty cycle. The state of the first electronic switch device 452, and therefore proportion of time the first supply voltage 450 is electrically connected to the first node 456, is based on the first duty cycle. Likewise, the second control signal 468 is based on the second input signal 478 having the second duty cycle. The state of the second electronic switch device 454, and therefore proportion of time the first node 456 is electrically connected to the ground voltage 460, is based on the second duty cycle.

When the first electronic switch device 452 is activated to electrically connect the first supply voltage 450 to the first node 456, the voltage V1 at the first node 456 is pulled to the first voltage level of the first supply voltage 450. The voltage V2 at the first integrator input 462 may be configured to be maintained at the level of the second voltage level of the second supply voltage 464 at the second integrator input 463. When the first electronic switch device 452 is activated, because the second voltage level is the first voltage level scaled by a predetermined amount, there will be a voltage difference between the voltage V1 at the first node 456 and the voltage V2 at the first integrator input 462. The voltage difference between V1 and V2 allows a path for current to flow through the resistor 458 and into the integrator circuit 443.

The integrator circuit 443 is configured to output a voltage proportional to the integral of the time that current flows while the potential difference between the first node 456 and the first integrator input 462 is non-zero. This amount of time depends on how long the first electronic switch device 452 is activated based on the first duty cycle of the first input signal 476.

When the second electronic switch device 454 is activated to electrically connect the first node 456 to the ground voltage 460, the voltage V1 at the first node 456 is pulled to the ground voltage 460. As the voltage V2 at the first integrator input 462 is maintained at the second voltage level there will be voltage difference between the voltage V2 at the first integrator input 462 and V1 to cause current flow in the opposite direction through the resistor 458 as compared to when the first electronic switch device 452 is closed (e.g., drawn from the integrator circuit 443 to the ground voltage 460). The integrator output level of the integrator circuit 443 may therefore change in the opposite direction as compared to when the first electronic switch device 452 is closed. In this case, the magnitude at the output of the integrator circuit 443 is configured to be proportional to the integral of the amount of time that current flows while the potential difference between the voltage V2 at the first integrator input 462 and the ground voltage 460 is non-zero. The amount of time depends on how long the second electronic switch device 454 is activated based on the second duty cycle of the second input signal 478.

Note while certain directions and voltage polarities have been suggested it should be appreciated that in various applications the directions and voltage polarities may be reversed (e.g., nodes at ground or power supplies may be reversed or "negative" voltage levels may be used).

When both the first electronic switch device 452 and the second electronic switch device 454 are both open (e.g., un-activated such that there is no electrical connection between the two sides) then there will be no path for current to flow in or out of the first node 456 and the integrator output 445 will keep its current value.

As described above, the integrator output level at the integrator output 445 of the integrator circuit 443 will change in opposite directions based on whether the first electronic switch device 452 is activated or the second electronic switch device 454 is activated. If the time each of the first electronic switch device 452 and the second electronic switch device 454 is activated is the same over a cycle or some time period (e.g., magnitudes of the first and second duty cycles of the first and second input signals 476 and 478 are the same) then the integrator output average over the time period is effectively the same (e.g., the output voltage changed by the same amount but in opposite directions). In this case, the filtered output of the filter circuit 444 should not change over the cycle or time period. As the output circuit 446 is configured to produce an output signal with a duty cycle that is based on the level of the filtered output of the filter circuit 444, in this situation the duty cycle of the output signal does not change. If the duty cycles of the first duty cycle and the second duty cycles are the same, then the output signal 480 of the output circuit 446 reaches an equilibrium. In this case the third duty cycle of the output signal 480 matches the first duty cycle of the first input signal 476.

If the first duty cycle of the first input signal 476 is greater than the second duty cycle of the second input signal 478 then the first electronic switch device 452 will be activated for a longer time period than the time period the second electronic switch device 454 is activated. The integrator output level of the integrator circuit 443 is configured to change proportional to the integral of this amount of time (e.g., the difference between activation times of each of the two switches 452 and 454 in a cycle). In response to a corresponding adjustment of the integrator output level, the output circuit 446 is configured to increase the duty cycle of the output signal 480 proportional to the change in voltage at the filter output of the filter circuit 444. The duty cycle of the output signal 480 becomes therefore closer in magnitude to the first duty cycle of the first input signal 476. The output signal 480 is provided as feedback as the second input signal 478. If the first duty cycle of the first input signal 476 stayed at the same increased level as the previous cycle, then due to the increased second duty cycle of the output signal 480/second input signal 478, the difference in time that the first electronic switch device 452 is activated as compared to the time that the second electronic switch device 454 is activated is reduced as compared to the previous cycle. However, as there is still a difference in the amount of time each switch device 452 and 454 is activated, the output duty cycle of the output signal 480 is increased again to closer match the first duty cycle of the first input signal 476. Fairly quickly (e.g., over several more cycles), the two duty cycles will be the same and the loop achieves equilibrium where the output duty cycle of the output signal 480 matches the first duty cycle of the first input signal 476.

Alternatively, the first duty cycle of the first input signal 476 may at some point be less than the second duty cycle of the second input signal 478. In this case, the first electronic switch device 452 may be activated for a shorter period of time than the period of time the second electronic switch device 454 is activated. The integrator output level of the integrator circuit 443 is adjusted as a result which causes the output circuit 446 to decrease the duty cycle of the output signal 480. The feedback loop then adjusts the second duty cycle of the second input signal 478 accordingly until the first duty cycle and the second duty cycle match. In certain implementations, the first electronic switch device 452 and the second electronic switch device 454 are configured to not be activated (e.g., closed) simultaneously since this will create a "short" from the first voltage supply 450 to the ground voltage 460 (e.g., both the switch devices 452 and 454 are off/open when both first and second input signals 476 and 478 are high). One example configuration for accomplishing this will be explained with reference to FIG. 5.

As such, the duty locked loop circuit 420 is configured to compare the first duty cycle of the first input signal 476 with the second duty cycle of the second input signal 478 to provide a filtered signal proportional to the integral of the duty cycle difference between the first and second duty cycles. The output circuit 446 is configured to adjust the output duty cycle of the output signal 480 based on the duty cycle such that the output duty cycle of the output signal 480 settles over time to match the first duty cycle of the first input signal 476. The output duty cycle of the output signal 480 generally corresponds to an average duty cycle of the first input signal 476 over a time period.

Figure 5:
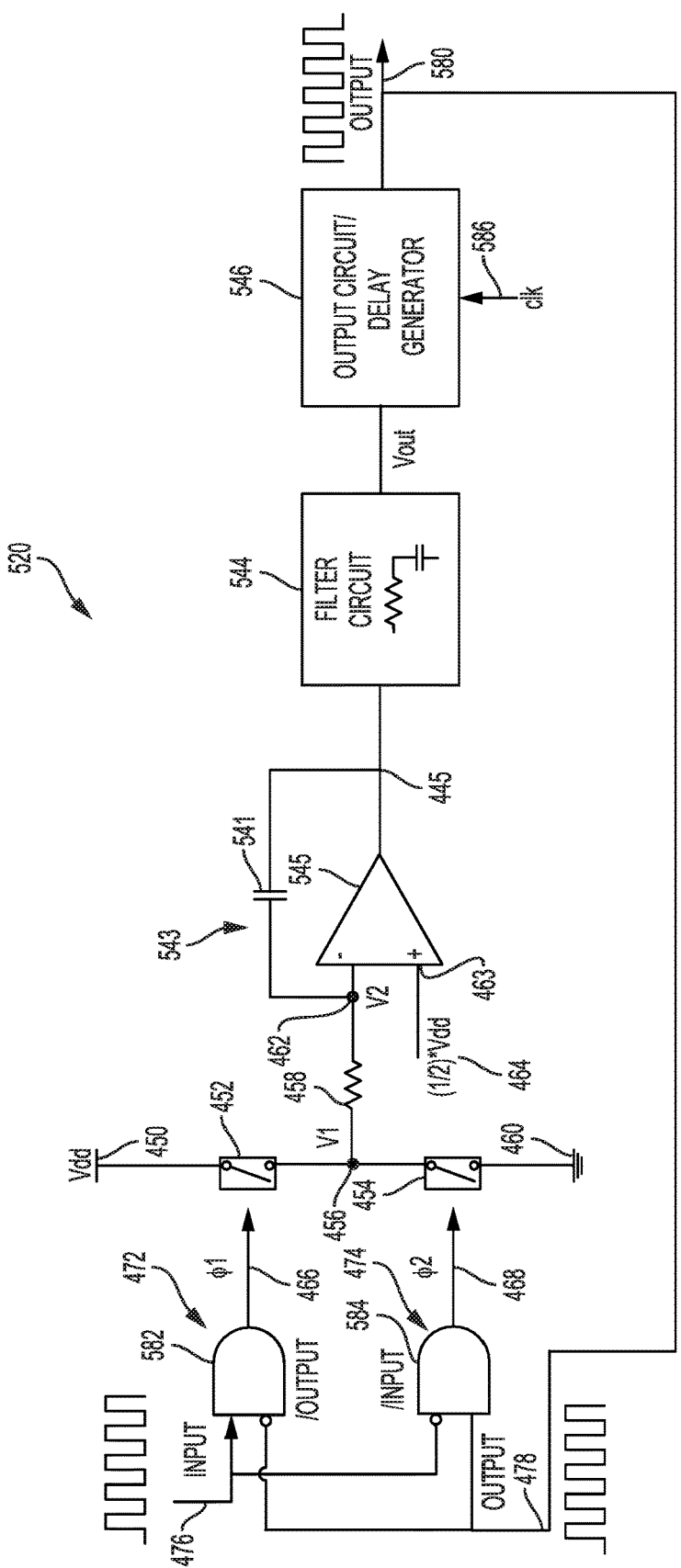
FIG. 5 is a schematic diagram of an example of a more particular implementation of the duty locked loop circuit of FIG. 4.

FIG. 5 is a schematic diagram of an example of a more particular implementation of the duty locked loop circuit 420 of FIG. 4. The duty locked loop circuit 520 of FIG. 5 includes an example of an implementation of the integrator circuit 443 of FIG. 4. The integrator circuit 543 of FIG. 5 includes an operational amplifier 545. The operational amplifier 545 has a first integrator input 462 (e.g., also first amplifier input) electrically connected to the first node 456 via the resistor 458. The operational amplifier has a second integrator input 463 (e.g., also second amplifier input) electrically connected to the second supply voltage 464. The operational amplifier 545 has an integrator output 445 electrically connected to the input of the filter circuit 544. The integrator circuit 543 includes a capacitor 541 electrically connected between the integrator output 445 and the first integrator input 462. The operational amplifier 545 with the negative feedback via the capacitor 541 is configured to provide an integrator output voltage at the integrator output 445. The integrator output voltage has a magnitude that is proportional to the integral of the duration of a non-zero voltage V2 at the first integrator input 462 when current can flow into and out of the capacitor 541 in the negative feedback path.

In FIG. 5, the second voltage level of the second supply voltage 464 is at a value that is one half the voltage of the first voltage level of the first supply voltage 450. As noted above, generating a voltage level that is half the voltage of another voltage level may be done with high accuracy while avoiding complicated circuitry. This may allow for increased accuracy of the duty locked loop circuit 520.

As described above with reference to FIG. 4, when the first electronic switch device 452 is activated to electrically connect the first supply voltage 450 to the first node 456, the voltage V1 at the first node 456 is pulled to the first voltage level of the first supply voltage 450. The operational amplifier 545 with the negative feedback path through the capacitor 541 is configured to maintain the voltage V2 at the first integrator input 462 substantially equal to the second voltage level at the second integrator input 463 of the second supply voltage 464 which is at half of the first voltage level of the first supply voltage 450. As a result, when the first electronic switch device 452 is activated to pull the voltage V1 at the first node 456 to the first voltage level, there will be a voltage difference between the voltage V1 at the first node 456 and the voltage V2 at the first integrator input 462 across the resistor 458. This will cause a current to flow through the resistor 458 into the capacitor 541 and start charging the capacitor while the first electronic switch device 452 is activated. Charging the capacitor will change the voltage at the integrator output 445 by a level proportional to the duration of the time the first electronic switch device 452 is activated.

When the second electronic switch device 454 is activated, the first node 456 is electrically connected to the ground voltage 460. In this case, as the voltage V2 at the first integrator input is configured to be at half of the first voltage level of the first supply voltage 450, there will be a voltage difference between the voltage V2 at the first integrator input 462 and the ground voltage at V1 that causes current to flow through the resistor 458 in the other direction (relative to when the first electronic switch device 452 is activated) such that current is drawn from the capacitor (e.g., discharging the capacitor) through the resistor 458 towards the ground voltage 460.

The resistor 458 is configured to avoid mismatch and generate either a constant pull-up current and a pull-down current (e.g., acting as either current source or current sync) depending on activation of the first and second electronic switch devices 452 and 454.

As described above, the amount of time the first and second electronic switch devices 452 and 454 are activated depends on the first and second duty cycles respectively of the first and second input signals 476 and 478. If the first duty cycle of the first input signal 476 is the same as the second duty cycle of the second input signal 478 then the time the first and second electronic switch devices 452 and 454 are activated will be substantially the same. As a result, the capacitor 541 will be charged and then discharged by the same amount and the output voltage at the filter circuit 544 would generally be unchanged within a cycle (e.g., resulting in no change in the output duty cycle of the output circuit 546). However, if the first duty cycle of the first input signal 476 is either greater or lower than the second duty cycle of the second input signal 478 then the amount of time the capacitor 541 is charged will be different than the amount of time the capacitor 541 is discharged. This will be reflected by an adjusted voltage level at the integrator output 445.

The adjusted output voltage level is provided to the filter circuit 544 to provide an averaged voltage level Vout (e.g., provide generally DC voltage level) that is proportional to the integral of the duty difference between the first duty cycle of the first input signal 476 and the second duty cycle of the second input signal 478. The filter circuit 544 is shown to include a low pass RC filter although other reactive elements or filtering components such as one or more capacitor or inductors (or combination thereof) may also be provided.

The output circuit 546 is shown as a delay generator configured to receive a clock signal 586. The output circuit 546 is configured to output an output signal 580 that has an output duty cycle corresponding to the voltage level Vout with an edge (e.g., rising or falling) that is aligned to an edge (e.g., rising or falling) of a clock signal 586 (generally the output signal 580 may be non-linearly related to an input control voltage). For example, the beginning of a cycle of the output signal is synchronized with a clock signal 586. Differences in duty cycle between the first and second input signals 476 and 478 are configured to cause the output circuit 546 to provide an output signal 580 with an adjusted output duty cycle. The adjusted output signal 580 is provided as the second input signal 478 and the output signal 580 will reach equilibrium when the second duty cycle of the second input signal 478 is the same as the first duty cycle of the first input signal 476.

The duty locked loop circuit 520 also includes example implementations of the first control signal generator circuit 472 and the second control signal generator circuit 474 of FIG. 4. The first and second control signal generator circuit 472 and 474 of FIG. 5 are configured in a way such that the first and second electronic switch devices 452 and 454 are not activated simultaneously (e.g., creating uninterrupted current path from the first supply voltage 450 to the ground voltage 460). This may avoid some current losses.

The first control signal generator circuit 472 of FIG. 5 includes a first AND circuit 582 with one inverted input that is configured to receive the first input signal 476 at a first input and receive an inverted version (based on the inverted input) of the second input signal 478 at a second input. The first AND circuit 582 is configured to generate the first control signal 466 based on the first input signal 476 and the inverted version of the second input signal 478. In an aspect, the first AND circuit 582 is configured to output a generally bi-level signal (e.g., between high and low levels) and output a relative high signal (e.g., sufficient to activate the first electronic switch device 452) when the first input signal 476 has a relative high level while the second input signal 478 is at a relative low level (e.g., both the first and second input signals 476 and 478 correspond to PWM signals with relatively binary levels within each cycle that include a proportion of time at a high and low level—or at least have generally two distinct states).

The second control signal generator circuit 474 of FIG. 5 includes a second AND circuit 584 with one inverted input that is configured to receive the second input signal 478 at a first input and receive an inverted version (based on operation of the inverted input) of the first input signal 476 at a second input. The second AND circuit 584 is configured to generate the second control signal 468 based on the second input signal 478 and the inverted version of the first input signal 476. In an aspect, the second AND circuit 584 is configured to output a relative high signal (e.g., sufficient to activate the second electronic switch device 454) when the second input signal 478 has a relative high level while the first input signal 476 is at a relative low level.

In this way the first and second control signals 466 and 468 are configured to not be at a high level (e.g., level sufficient to activate a corresponding switch device) at the same time in a manner such that the first and second electronic switch devices 452 and 454 are not activated at the same time.

The first control signal generator circuit 472 and the second control signal generator circuit 474 may be optional therefore in an aspect the AND circuits 582 and 584 may not be in included in the duty locked loop circuit 520 of FIG. 5 (or some other alternative circuit may be provided). Alternatively, the first and second input signals 476 and 478 may be the first and second control signals 466 and 468. This may result in a situation where both the first and second electronic switch devices 452 and 454 are activated simultaneously. This may create a direct path from the first supply voltage 450 directly to the ground voltage 460 and results in some current loss. However, in some implementations this loss may be tolerated or limited by adding current limiter circuitry. For example, alternative implementations might include current limiting circuitry between the first supply voltage 450 and the first node 456 as well as between the first node 456 and the ground voltage 460.

Figure 6:
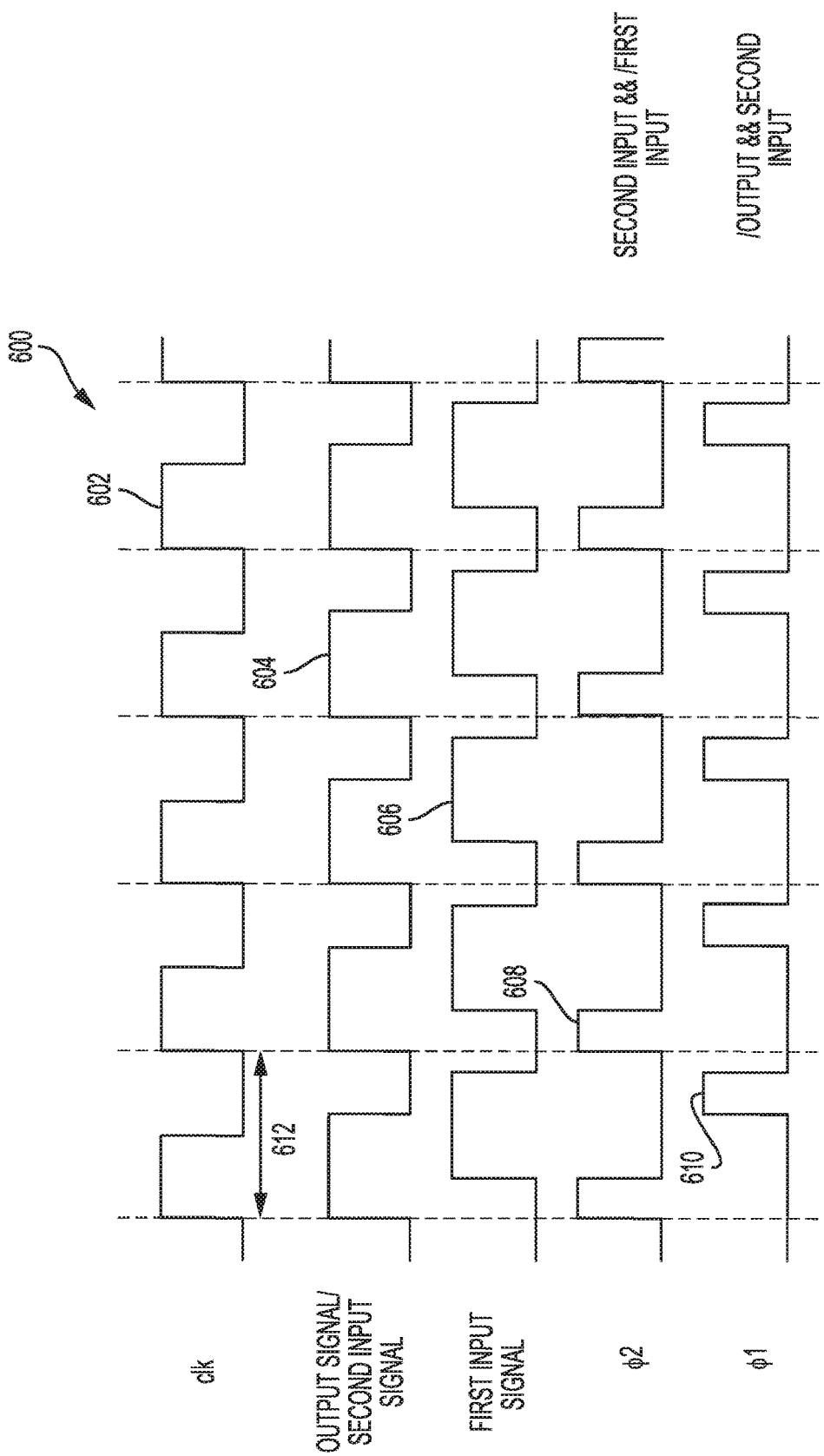
FIG. 6 is a timing diagram of several example waveforms associated with the duty locked loop circuit of FIG. 5.

FIG. 6 is a timing diagram 600 of several example waveforms associated with the duty locked loop circuit 520 of FIG. 5. The timing diagram 600 includes a clock waveform 602 corresponding to a clock signal 586. The timing diagram 600 further includes a first input signal waveform 606 corresponding to the first input signal 476 and a second input signal waveform 604 corresponding to the second input signal 478 which also corresponds to the output signal 580. The timing diagram 600 further includes a first control signal waveform 610 corresponding to the first control signal 466 and labeled as Φ1. The timing diagram 600 further includes a second control signal waveform 608 corresponding to the second control signal 468 and labeled as 12.

The timing diagram 600 shows a scenario at equilibrium where the duty cycle of the first input signal 476 is the same as the duty cycle of the second input signal 478. As noted above, in FIG. 5, the output circuit 546 is configured as a delay generator to synchronize an edge of the output signal 580 with and edge of a clock signal 586. As such, in FIG. 6 a rising edge of the second input signal waveform 604 is synchronized with a rising edge of the clock signal waveform 602. Based on the timing of the input signal waveforms 604 and 606, the timing diagram 600 shows that the first control signal waveform 610 is at a relative high level when both the first input signal waveform 606 is at a high level while the second input signal waveform 604 is at a low level. Otherwise, the first control signal waveform 610 is at a low level at all other portions of the cycle 612 based on the operation of the first AND circuit 582. Likewise, the second control signal waveform 608 is at a relative high level when both the second input signal waveform 604 is at a high level and the first input signal waveform 606 is at a low level. Otherwise, the second control signal waveform 608 is at a low level at all other portions of the cycle 612 based on operation of the second AND circuit 584. As shown, the first and second control signal waveforms 608 and 610 are not simultaneously at high levels within a cycle 612 (such that the switch devices 452 and 454 are not activated simultaneously).

To further illustrate the principle of operation, below are equations for equilibrium conditions where the input offset of the operational amplifier 545 is at $V_{os}$ while other elements of the equations are referenced above.

$$\phi_1 \times V_2/R = \phi_2 \times Vdd - V_2/R \qquad \text{Equation 1:}$$

$$\phi_1 = \phi_2 \times Vdd - V_2/V_2 = \phi_2 \times (1 - Vdd - 2 \times V_2/V_2) \qquad \text{Equation 2:}$$

$$V_2 = \frac{1}{2} \times Vdd + V_{os} \qquad \text{Equation 3:}$$

In accordance with these equations, for purposes of illustration, if $V_{os}$ is equal to zero and the voltage V2 at the first integrator input is half of the level of the first supply voltage 450 then the equations demonstrate conditions when the duty cycles are equivalent. As a further example, if the output voltage $V_{os}$ increases to 1 mV and the level of the first supply voltage is 1.8 Volts then V2 would be half or about 0.9 V and in this case the difference between the times for the control signals to be high is according to the following: $\phi 1 = 0.9978 \times \phi 2$. For purposes of providing an example, the frequency of the cycle 612 may be on the order of MHz (e.g., 3.2 MHz). These values are provided for purposes of illustration only.

More generally, if the amount of time the first input signal waveform 606 is high is longer (or shorter) than the amount of time the second input signal waveform 604 is high (corresponding to a higher duty cycle for the first input signal 476) the amount of time the first control signal waveform 610 is high will be longer (or shorter) than the amount of time the second control signal waveform 608 is high over a cycle 612. This will result in disproportionate charging and discharging of the capacitor 541 which will adjust the voltage at the filter circuit at a level proportional to the integral of the difference in duty cycles between the first and second input signals 476 and 478. The output circuit 546 is configured to generate an output signal with a duty cycle based on the output voltage of the filter circuit 544 and synchronized with the clock signal 586.

Figure 7:
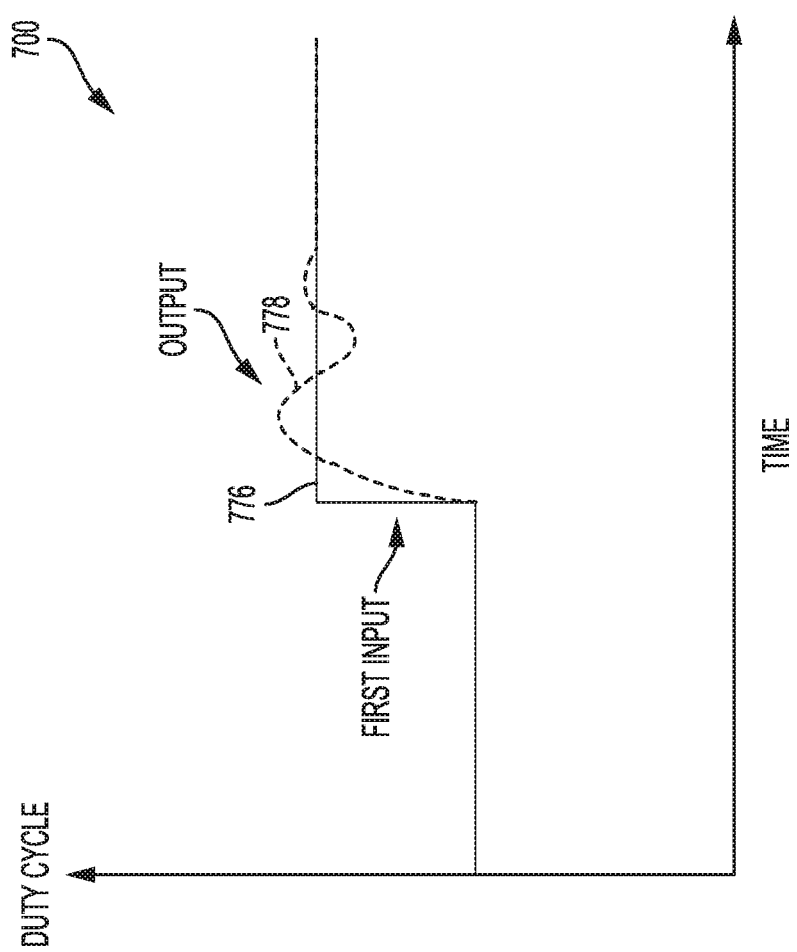
FIG. 7 is a plot of a transient response of an output of the duty locked loop circuit of FIG. 4 when a duty cycle of an input signal is stepping up.

FIG. 7 is a plot 700 of a transient response of an output of the duty locked loop circuit 420 of FIG. 4 when a duty cycle of an input signal 478 is stepping up. The plot 700 shows the magnitude 776 of the duty cycle of the first input signal 476 over time as compared to the magnitude 778 of the duty cycle of the output signal 480 (also corresponding to the second input signal 478). The plot 700 illustrates what happens when there is an abrupt increase in the magnitude 776 of the first duty cycle of the first input signal 476. For example, in the SMPS circuit 300 of FIG. 3 the increase in duty cycle of the first input signal 476 may correspond to a sudden change in the amount of current the load 301 draws which results in an adjustment to the duty cycle presented to the driver circuit 332 of the SMPS circuit 300. The sudden change in the duty cycle causes the first input signal 476 for the duty locked loop circuit 420 to have a significantly different duty cycle than the second input signal 478. As described above, the duty locked loop circuit 420 is configured to adjust the magnitude 778 of the duty cycle of the output signal 480 in response to the difference between duty cycles. The magnitude 778 of the duty cycle of the output signal 480 begins to rise but lags the magnitude 776 of the duty cycle of the first input signal 476 (e.g., doesn't rise as abruptly). The magnitude 778 of the duty cycle of the output signal 480 finally settles to the same magnitude 776 of the duty cycle of the first input signal 476 after a period of time. The settling behavior may depend on the overall loop bandwidth and phase margin. As such the magnitude 778 of the duty cycle of the output signal 480 corresponds to an average duty cycle of the system over a period of time. As noted above, for a SMPS circuit 300, the DC operating voltage can be regulated more accurately based on the increased accuracy of the duty locked loop circuit 420 of FIG. 4.

Figure 8:
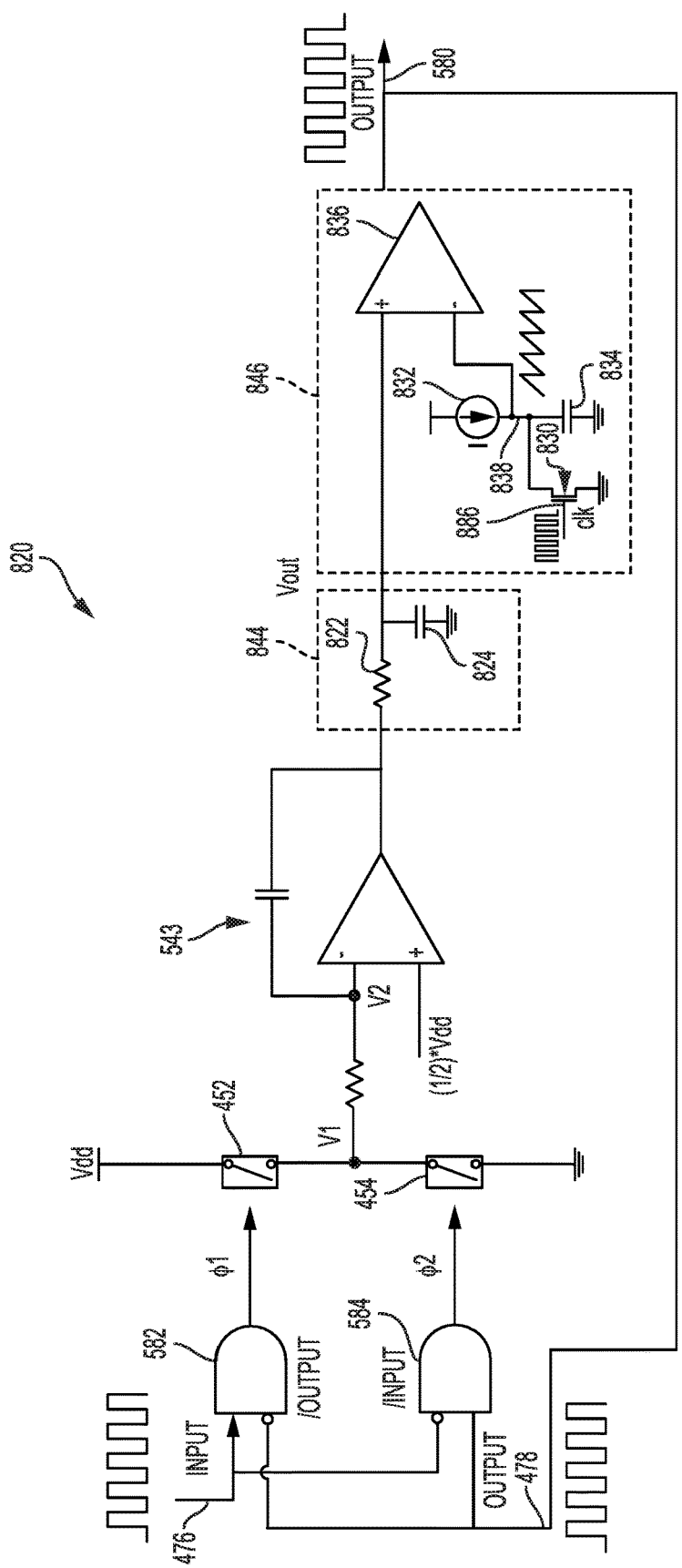
FIG. 8 is a schematic diagram of an example of a more particular implementation of the duty locked loop circuit of FIG. 5.

FIG. 8 is a schematic diagram of an example of a more particular implementation of the duty locked loop circuit 520 of FIG. 5. In particular, the duty locked loop circuit 820 of FIG. 8 includes example implementations for the filter circuit 544 of FIG. 5 and the output circuit 546 of FIG. 5 for purposes of illustration. The filter circuit 844 of the duty locked loop circuit 820 of FIG. 8 includes an RC filter circuit (e.g., low pass) including a resistor 822 and capacitor 824 coupled in parallel. The elements and arrangement of the filter circuit 844 is just one example for the purposes of illustration and the filter circuit 844 may have one or more other capacitor or inductors or combinations in different arrangements as will be appreciated.

The output circuit 846 of the duty locked loop circuit 820 of FIG. 8 provides an example implementation configured to output a signal with a duty cycle proportional to the voltage level at the filter output of the filter circuit 844 that is synchronized with an edge of a clock signal 886. The output circuit 846 includes a comparator circuit 836 configured receive the voltage level at the output of the filter circuit 844 at a first comparator input and a sawtooth waveform based on a clock signal 886 at a second comparator input. To generate the sawtooth waveform, the output circuit 846 includes a switch device 830 configured to be controlled (e.g., selectively activated) by the clock signal 886. A drain of the switch device 830 is electrically connected to a node 838 that is electrically connected between a current source 832 and a capacitor 834. The node 838 is also electrically connected to the second comparator input. As a result of the switching operation controlled by the clock signal 886 and the capacitor 834, a sawtooth waveform (e.g., voltage) synchronized to the clock signal 886 is provided to the second comparator input. The comparator 836 is configured to output a generally bi-level signal (e.g., one of two high or low states) based on whether the voltage at the first comparator input is higher or lower than the voltage (based on the sawtooth waveform) at the second comparator input. As a result, the comparator 836 is configured to output an output signal 580 that has a duty cycle proportional to the voltage at the output of the filter circuit 844 which is also synchronized with an edge of the clock signal 886. The output circuit 846 is one example implementation of the output circuit 546 of FIG. 5 but other implementations are also possible as would be appreciated. It is also noted that the AND circuits 582 and 584 are also optional in the duty locked loop circuit 820 of FIG. 8 and could be replaced with another circuit or the first input signal 476 and the second input signal 478 (or just one or the other).

Figure 9:
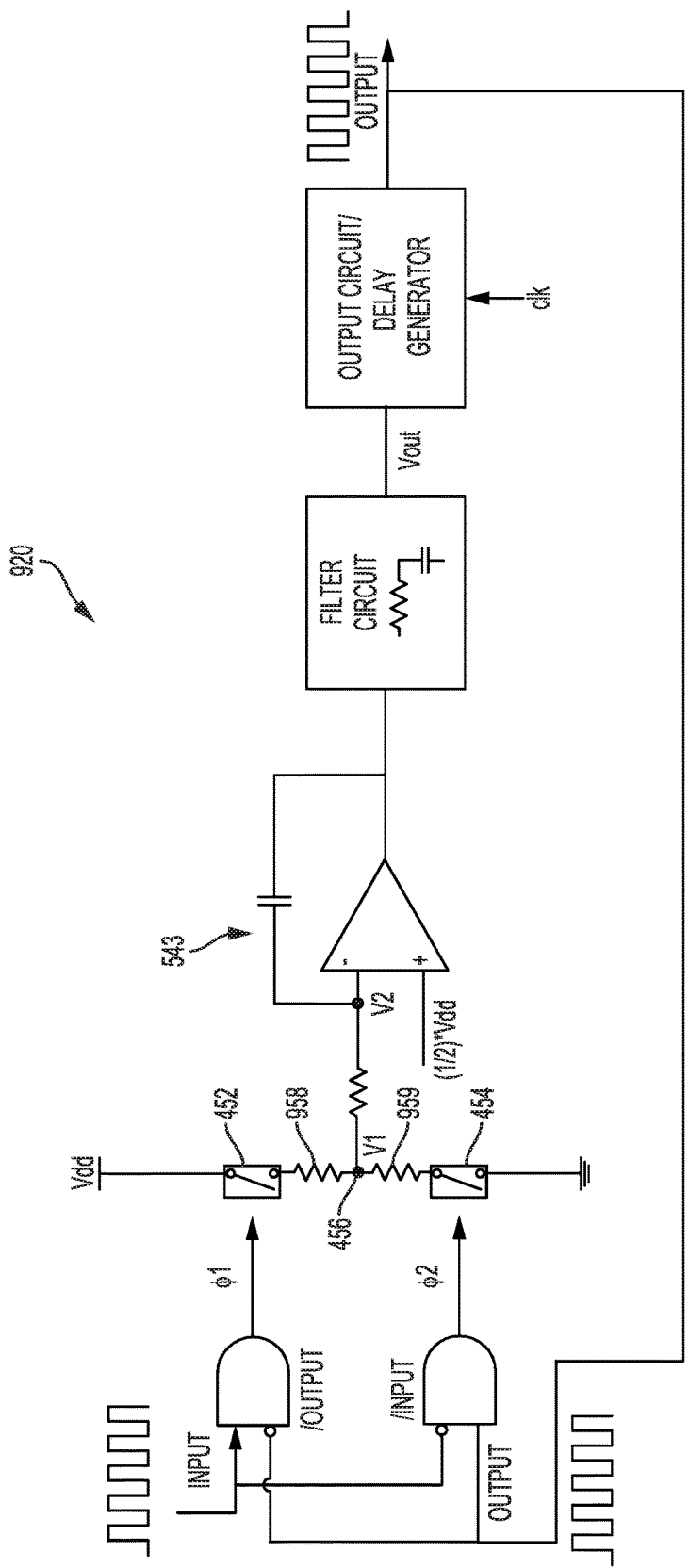
FIG. 9 is a schematic diagram of another example of a more particular implementation of the duty locked loop circuit of FIG. 5.

FIG. 9 is a schematic diagram of another example of a more particular implementation of the duty locked loop circuit 520 of FIG. 5. The duty locked loop circuit 920 of FIG. 9 generally includes all the elements of FIG. 5 which are described above. In place of the resistor 458 of FIG. 5, the duty locked loop circuit 920 of FIG. 9 includes a first resistor 958 electrically connected between the first electronic switch device 452 and the first node 456 and a second resistor 959 electrically connected between the first node 456 and the second electronic switch device 454. As such each of the first and second resistors 958 and 959 are provided to prevent current mismatch. This therefore may be one alternative implementation to the duty locked loop circuit 520 of FIG. 5 and the operation of the circuit is similar in both implementations.

While certain electrical connections have been described herein it is noted that the elements may either be directly electrically connected or there may be certain intervening elements electrically connected in between (e.g., the text does not preclude intermediate elements). Furthermore, electrical connections of the various elements may be provided via different various electric coupling techniques that would be appreciated.

In an aspect, a duty locked loop circuit in accordance with the present disclosure includes an integrator circuit controlled by a switch network. The switch network is controlled by a first input signal and a second input signal. The integrator circuit is configured to generate an output voltage proportional to the integral of the difference between a first duty cycle of the first input signal and a second duty cycle of the second input signal. A voltage level at an integrator input is based on a first voltage level of a supply voltage and a second voltage level that corresponds to the first voltage level of the supply voltage scaled by a predetermined amount.

The duty locked loop circuit includes an output circuit configured to generate an output signal having a duty cycle that is based on the output voltage and is synchronized to an edge of a clock signal. In some aspects the output signal may be provided to a switched mode power supply circuit.

In another aspect, a duty locked loop circuit is provided including means for controlling an input voltage proportional to the integral of the difference between a first duty cycle of a first input signal a second duty of a second input signal. In an aspect, the input voltage is based on a first voltage level of a supply voltage and a second voltage level that corresponds to the first voltage level of the supply voltage scaled by a predetermined amount. The duty locked loop circuit further means for performing an integration operation of the input voltage to generate an output voltage based on the difference. The duty locked loop circuit further includes means for generating an output signal having an output duty cycle that is based on the output voltage.

Figure 10:
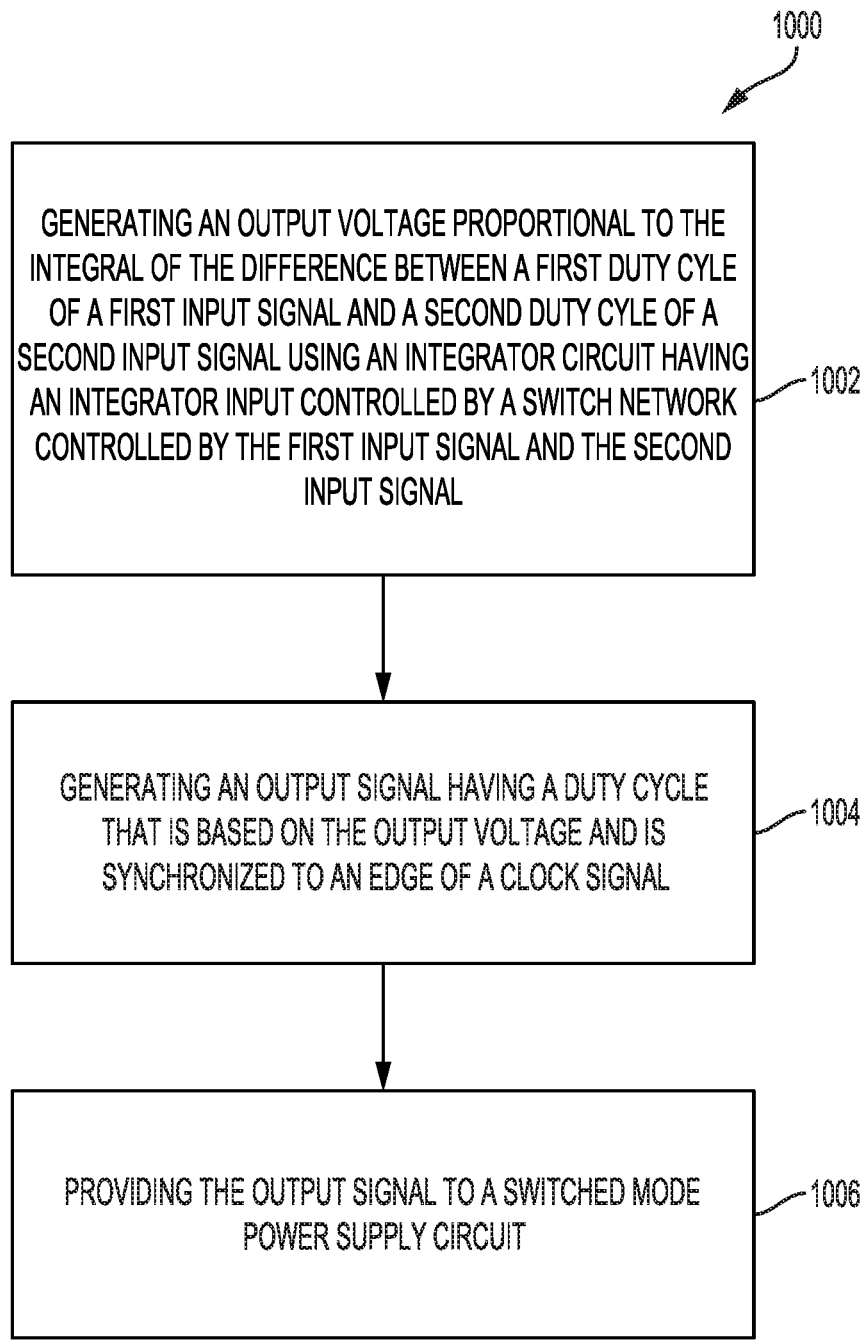
FIG. 10 is a flowchart of a method of regulating power in a switched mode power supply circuit

FIG. 10 is a flowchart of a method 1000 of regulating power in a switched mode power supply circuit (e.g., the SMPS circuit 300 of FIG. 3). The method 1000 is described with reference to the elements of FIG. 4, however, as noted above, operations described may be performed using any suitable circuitry or component, which may provide means for implementing one or more of the operations.

At operational block 1002, the method 1000 includes generating an output voltage proportional to the integral of the difference between a first duty cycle of a first input signal and a second duty cycle of a second input signal using an integrator circuit 443 having an integrator input 462 controlled by a switch network (e.g., electronic switch devices 452 and 454) controlled by the first input signal 476 and the second input signal 478. A voltage level V2 at the integrator input 462 may be based on a first voltage level of a supply voltage 450 and a second voltage level that corresponds to the first voltage level of the supply voltage 450 scaled by a predetermined amount. In an aspect, the method may include filtering an output of the integrator circuit 443 to produce the output voltage.

At operational block 1004, the method includes generating an output signal 480 having a duty cycle that is based on the output voltage and is synchronized to an edge of a clock signal.

At operational block 1006, the method includes providing the output signal to the switched mode power supply circuit 300 (FIG. 3). This block 1006 could be optional in implementations where the method is applied in a different application where differences between duty cycles are determined.

Figure 11:
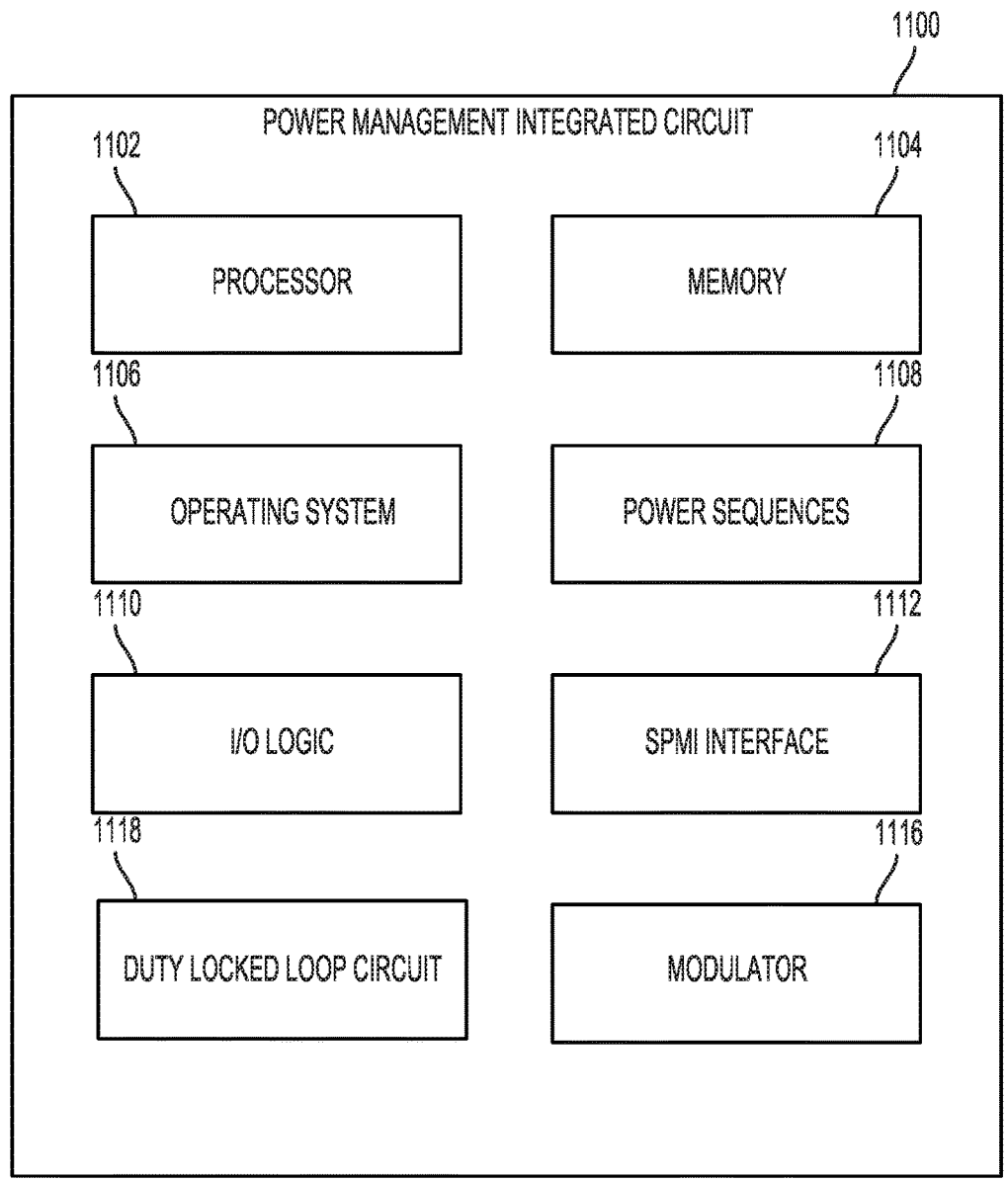
FIG. 11 is a functional block diagram of an example of an integrated circuit capable of implementing aspects of the duty locked loop circuitry as described above.

FIG. 11 is a functional block diagram of an example of a power management integrated circuit 1100 capable of implementing aspects of the duty locked loop circuitry as described above. Entities of the PMIC 1100 may be implemented in combination or separately in any suitable circuitry or package, such as a system-on-chip (SoC), application specific integrated-circuit (ASIC), switched mode power supply (SMPS) controller, embedded controller, power regulation module, or other like ICs. For example, the PMIC 1100 can be implemented as an SMPS controller with embedded switch devices for a switching regulator or a multi-phase switching regulator. The PMIC 1100 may also be implemented as, or part of, other power regulation circuitry, such as battery charging circuitry, a low-dropout regulator, a light-emitting diode (LED) driver, inductive power transfer circuitry, an audio amplifier, or other circuits that implement DC-DC power regulation or conversion.

In this particular example, the PMIC 1100 includes a processor 1102 (e.g., microprocessor) and memory 1104. The memory 1104 may include any suitable type of memory, such as volatile memory (e.g., DRAM), non-volatile memory (e.g., Flash), or other like memories. The memory 1104 is implemented as a storage medium, and thus does not include transitory propagating signals or carrier waves. The memory 1104 can store data and processor-executable instructions of the PMIC 1100, such as an operating system 1106 of the system and power sequences 1108. The power sequences 1108 may include programmable start-up power sequences or power profiles for respective output voltages and timings (e.g., start-up or adjustment) of switching regulators controlled by the PMIC 1100. Generally, the processor 1102 executes the operating system 1106 and power sequences 1108 from the memory 1104 to implement various functions of the PMIC 1100, such as to manage power regulation in a system in which the PMIC 1100 is embodied.

The PMIC 1100 may also include I/O logic 1110 and a system power management interface 1112 (SPMI 1112). The I/O logic 1110 can be configured to provide a variety of I/O ports, such as general purpose I/Os (GPIOs), gate drive circuitry to drive switch devices of a regulator (not shown), or analog-to-digital circuitry to sample voltage or signals (e.g., voltage feedback signals) at I/O nodes of the PMIC 1100. The SPMI interface 1112 may enable communication with other power-related entities of a system over an SPMI-compliant data bus or similar inter-IC data channel. For example, the PMIC 1100 may communicate, via the SPMI 1112 to coordinate start-up or voltage adjustments of power regulation circuitry.

The PMIC 1100 also includes a duty locked loop circuit 1118 and a modulator 1116 which may be implemented similarly to or differently from the entities described with reference to FIGS. 1-9. The duty locked loop circuit 1118 can be embodied separately or combined with other components of the PMIC 1100.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. For example, the means for controlling an input voltage proportional to difference between a first duty cycle of a first input signal a second duty of a second input signal may correspond to the circuit configurations and connections related to the first and second electronic switch devices 452 and 454 along with the supply voltages 450 and 464 of FIG. 4. In addition, the means for performing an integration operation of the input voltage to generate an output voltage based on the difference may correspond to the integrator circuit 443 of FIG. 4. In addition, the means for generating an output signal having an output duty cycle that is based on the output voltage may correspond to the output circuit 446 of FIG. 4.

Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general-purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The bus may also link various other circuits such as timing sources, peripherals, voltage regulators, power management circuits, and the like.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A duty locked loop circuit, the duty locked loop circuit comprising:
    a first electronic switch device configured to be controlled by a first control signal that is based on a first input signal having a first duty cycle, the first electronic switch device electrically connected between a first supply voltage and a first node, the first supply voltage having a first voltage level;
    a second electronic switch device configured to be controlled by a second control signal that is based on a second input signal having a second duty cycle, the second electronic switch device electrically connected between the first node and a ground voltage;
    an integrator circuit having a first integrator input, a second integrator input, and an integrator output, the first integrator input electrically connected to the first node, the second integrator input electrically connected to a second supply voltage having a second voltage level that corresponds to the first voltage level of the first supply voltage scaled by a predetermined amount;
    a filter circuit electrically connected to the integrator output; and
    an output circuit electrically connected to a filter output of the filter circuit and configured to receive an output voltage level at the filter output of the filter circuit, the filter circuit electrically connected between the integrator circuit and the output circuit, the output circuit configured to generate an output signal having a third duty cycle, a magnitude of the third duty cycle based on the output voltage level at the filter output of the filter circuit, the output signal configured to be provided as the second input signal.

2. The duty locked loop circuit of claim 1, wherein the output circuit is configured to provide the output signal to a switched mode power supply circuit.

3. The duty locked loop circuit of claim 1, wherein an integrator output voltage at the integrator output is proportional to a duty cycle difference between the first duty cycle and the second duty cycle.

4. The duty locked loop circuit of claim 1, wherein the second voltage level of the second supply voltage is substantially half the first voltage level of the first supply voltage.

5. The duty locked loop circuit of claim 1, wherein the third duty cycle of the output signal corresponds to an average duty cycle of the first input signal over a time period.

6. The duty locked loop circuit of claim 1, further comprising a resistor electrically connected between the first integrator input and the first node.

7. The duty locked loop circuit of claim 1, further comprising:
    a first resistor electrically connected between the first node and the first electronic switch device; and
    a second resistor electrically connected between the first node and the second electronic switch device.

8. The duty locked loop circuit of claim 1, wherein the integrator circuit comprises an operational amplifier and a capacitor electrically connected between the integrator output and the first integrator input.

9. The duty locked loop circuit of claim 1, wherein the output circuit is configured to synchronize a beginning of a cycle of the output signal with a clock signal.

10. The duty locked loop circuit of claim 1, wherein the output circuit is configured to align a rising or falling edge of the output signal to a rising or falling edge of a clock signal.

11. The duty locked loop circuit of claim 1, wherein the first control signal is configured to cause the first electronic switch device to electrically connect the first supply voltage to the first node.

12. The duty locked loop circuit of claim 1, wherein the second control signal is configured to cause the second electronic switch device to electrically connect the first node to the ground voltage.

13. The duty locked loop circuit of claim 1, further comprising:
    a first AND circuit configured to generate the first control signal based on inputs of the first input signal and an inverted version of the second input signal; and a second AND circuit configured to generate the second control signal based on inputs of the second input signal and an inverted version of the first input signal.

14. The duty locked loop circuit of claim 1, wherein the first control signal is the first input signal and wherein the second control signal is the second input signal.

15. The duty locked loop circuit of claim 1, wherein the filter circuit comprises at least one of a capacitor or an inductor or any combination thereof.

16. The duty locked loop circuit of claim 1, wherein the output circuit comprises a comparator circuit configured to receive a sawtooth waveform that is based on a clock signal and to receive the output voltage level at the filter output of the filter circuit.

17. The duty locked loop circuit of claim 1, further comprising a switched mode power supply circuit comprising a modulator circuit configured to receive a difference signal based on a difference between a switched mode output voltage of the switched mode power supply circuit and a reference voltage, wherein the output signal of the output circuit is configured to be provided to adjust an output of the modulator circuit.

18. The duty locked loop circuit of claim 8, wherein the operational amplifier is configured to receive the first integrator input at a first operational amplifier input, and wherein the operational amplifier is configured to receive the second integrator input at a second operational amplifier input different from the first operational amplifier input.

* * * * *